(12) United States Patent
Park et al.

(10) Patent No.: US 11,146,275 B2
(45) Date of Patent: Oct. 12, 2021

(54) SIGNAL GENERATION CIRCUIT AND A SEMICONDUCTOR APPARATUS USING THE SIGNAL GENERATION CIRCUIT

(71) Applicant: SK hynix Inc., Icheon-si (KR)

(72) Inventors: Gyu Tae Park, Icheon-si (KR); Jin Il Chung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 51 days.

(21) Appl. No.: 16/859,557

(22) Filed: Apr. 27, 2020

(65) Prior Publication Data

US 2021/0091772 A1 Mar. 25, 2021

(30) Foreign Application Priority Data

Sep. 20, 2019 (KR) .......................... 10-2019-0115871

(51) Int. Cl.
*H03L 7/081* (2006.01)
*H03K 3/037* (2006.01)
*H03K 3/017* (2006.01)

(52) U.S. Cl.
CPC ........... *H03L 7/0812* (2013.01); *H03K 3/017* (2013.01); *H03K 3/037* (2013.01)

(58) Field of Classification Search
CPC ....... H03L 7/0812; H03K 3/017; H03K 3/037
See application file for complete search history.

(56) References Cited

U.S. PATENT DOCUMENTS

| | | | | |
|---|---|---|---|---|
| 6,020,773 A * | 2/2000 | Kan | .......................... | H03K 5/13 327/152 |
| 6,055,287 A * | 4/2000 | McEwan | ............... | H03L 7/0812 375/376 |
| 6,359,483 B1* | 3/2002 | Watkins | .................... | G06F 1/10 327/158 |
| 9,385,696 B1* | 7/2016 | Jangity | .................... | H03K 5/05 |
| 9,838,029 B1* | 12/2017 | Gao | ....................... | H03K 3/017 |
| 10,270,429 B1* | 4/2019 | Wang | ........................ | G06F 1/04 |
| 10,320,386 B1* | 6/2019 | Ganusov | ................ | H03K 3/037 |
| 10,418,978 B1* | 9/2019 | Au Yeung | ............ | H03K 5/1565 |
| 2002/0190283 A1* | 12/2002 | Seno | ....................... | H03K 5/135 257/275 |
| 2006/0012410 A1* | 1/2006 | Lin | ....................... | H03L 7/0814 327/161 |
| 2007/0217559 A1* | 9/2007 | Stott | ..................... | H04L 7/0041 375/355 |

(Continued)

FOREIGN PATENT DOCUMENTS

KR 101166800 B1 7/2012
KR 101468677 B1 12/2014

*Primary Examiner* — Adam D Houston
(74) *Attorney, Agent, or Firm* — William Park & Associates Ltd.

(57) ABSTRACT

A signal generation circuit includes a synchronization circuit, a pulse width control circuit, and an output circuit. The synchronization circuit synchronizes an input signal with a clock signal to generate a synchronization signal. The pulse width control circuit generates a start signal from the synchronization signal and generate an end signal by delaying the synchronization signal by a time corresponding to an off control signal in synchronization with the clock signal. The output circuit generates an output signal based on the start signal and the end signal.

17 Claims, 9 Drawing Sheets

(56) References Cited

U.S. PATENT DOCUMENTS

| | | | | |
|---|---|---|---|---|
| 2010/0013530 A1* | 1/2010 | Kim | .................. | H03L 7/0812 |
| | | | | 327/149 |
| 2012/0313545 A1* | 12/2012 | Courtel | .................. | H05B 45/37 |
| | | | | 315/250 |
| 2014/0184292 A1* | 7/2014 | Lin | .................. | H03K 5/1565 |
| | | | | 327/175 |
| 2014/0184293 A1* | 7/2014 | Kim | .................. | H03K 3/017 |
| | | | | 327/175 |
| 2017/0201086 A1* | 7/2017 | Chen | .................. | H02H 3/08 |
| 2020/0249713 A1* | 8/2020 | Nadershahi | .................. | H03K 3/027 |
| 2020/0382269 A1* | 12/2020 | Lee | .................. | H04L 7/033 |
| 2020/0393868 A1* | 12/2020 | Oh | .................. | H03K 5/135 |
| 2021/0083579 A1* | 3/2021 | Hsu | .................. | H03K 3/037 |
| 2021/0091772 A1* | 3/2021 | Park | .................. | H03K 3/037 |

\* cited by examiner

… (1)

SIGNAL GENERATION CIRCUIT AND A SEMICONDUCTOR APPARATUS USING THE SIGNAL GENERATION CIRCUIT

CROSS-REFERENCES TO RELATED APPLICATION

The present application claims priority under 35 U.S.C. § 119(a) to Korean application number 10-2019-0115871, filed on Sep. 20, 2019, in the Korean Intellectual Property Office, which is incorporated herein by reference in its entirety.

BACKGROUND

1. Technical Field

Various embodiments generally relate to an integrated circuit technology, and more particularly, to a semiconductor apparatus which can operate in synchronization with a clock signal.

2. Related Art

An electronic device may include many electronic components. Among the electronic components, a computer system may include a large number of semiconductor apparatuses composed of semiconductors. The semiconductor apparatuses constituting the computer system may communicate with each other while transmitting and receiving clocks and data. The semiconductor apparatuses may operate in synchronization with a clock signal. The semiconductor apparatuses may internally generate various signals based on a signal transferred from an external device. The various signals may be delayed and generated by internal circuits of the semiconductor apparatuses. The delay may include synchronous delay and asynchronous delay. For example, a memory apparatus such as a DRAM (Dynamic Random Access Memory) may generate internal signals by using the synchronous delay for data and clock signals related to the data, and generate internal signals by using the asynchronous delay for control signals, such as a command signal and address signal, other than the data. However, when receiving or outputting data, the semiconductor apparatuses need to perform an operation of synchronizing the internal signals generated through the asynchronous delay with a clock signal again. Such an operation may be referred to as domain crossing. The semiconductor apparatuses need a circuit capable of generating a signal having a constant delay amount and pulse width, when performing the domain crossing operation. Furthermore, the semiconductor apparatuses need a circuit capable of generating a signal which can be enabled or disabled within an allowable range.

SUMMARY

In an embodiment, a signal generation circuit may include a synchronization circuit, a pulse width control circuit, and an output circuit. The synchronization circuit may be configured to generate a synchronization signal by synchronizing an input signal with a clock signal. The pulse width control circuit may be configured to generate a start signal by delaying the synchronization signal and generate an end signal by delaying the synchronization signal by a time corresponding to an off control signal in synchronization with the clock signal. The output circuit may be configured to enable an output signal based on the start signal and disable the output signal based on the end signal.

In an embodiment, a signal generation circuit may include a synchronization circuit, a pulse width control circuit, and an output circuit. The synchronization circuit may be configured to generate a synchronization signal by synchronizing an input signal with a clock signal, whenever the input signal is inputted. The pulse width control circuit may be configured to generate a start signal by delaying the synchronization signal and generate an end signal by delaying the synchronization signal by a time corresponding to an off control signal in synchronization with the clock signal. The output circuit may be configured to enable an output signal based on a start signal which does not overlap the end signal and disable the output signal based on an end signal which does not overlap the start signal.

DETAILED DESCRIPTION

Various embodiments may be directed to a signal generation circuit for generating an output signal which can be enabled and disabled at accurate timings during a high speed operation, and retain a pulse width during a target interval, and a semiconductor apparatus using the same.

The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Figure 1:
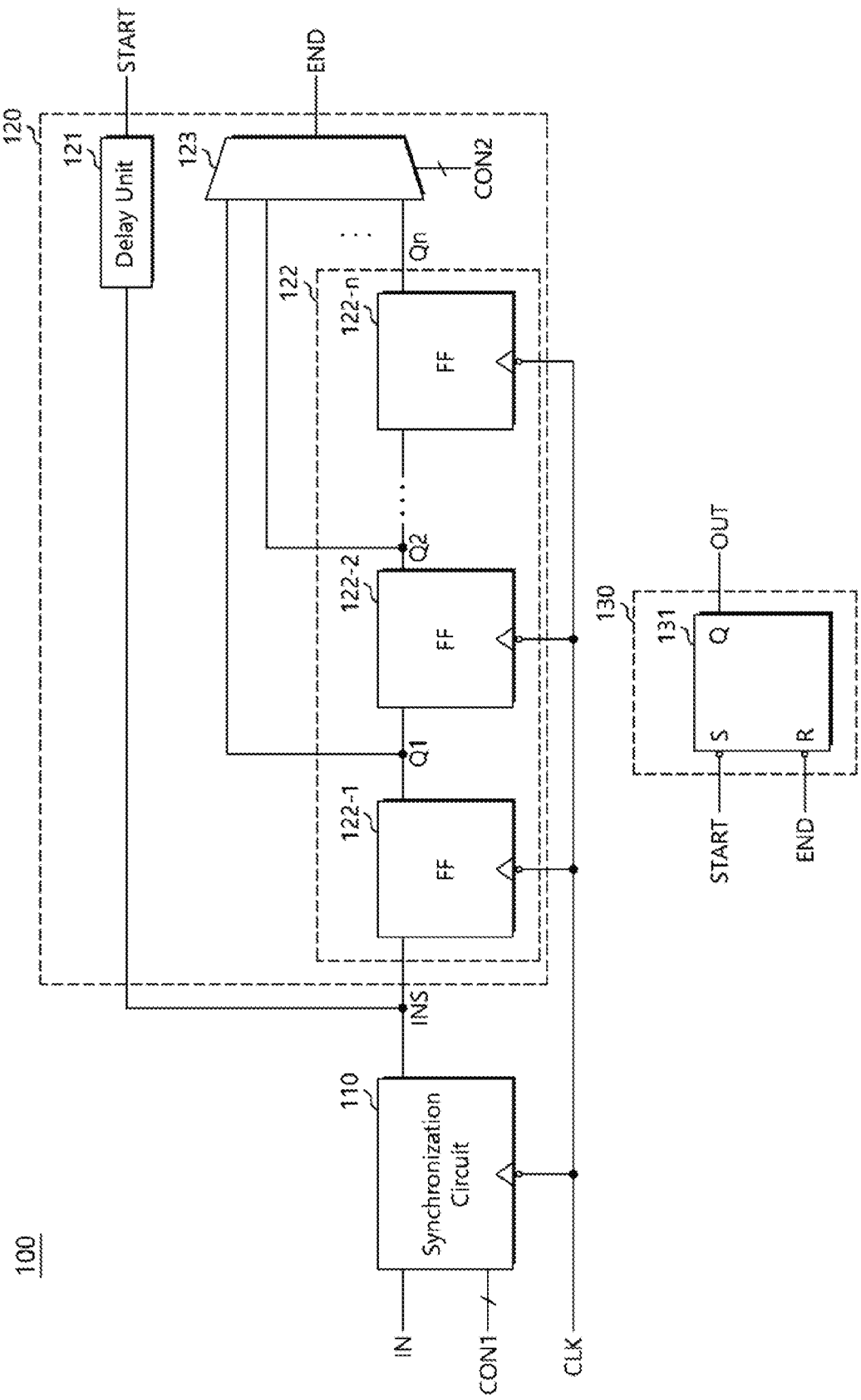
FIG. 1 is a diagram illustrating a configuration of a signal generation circuit in accordance with an embodiment.

FIG. 1 is a diagram illustrating a configuration of a signal generation circuit 100 in accordance with an embodiment. Referring to FIG. 1, the signal generation circuit 100 may receive an input signal IN and a clock signal CLK and generate an output signal OUT. The signal generation circuit 100 may synchronize the clock signal CLK with the input signal IN, and generate the output signal OUT synchronized with the clock signal CLK. The signal generation circuit 100 may generate the output signal OUT, which is enabled at desired timing, by delaying the input signal IN. The signal generation circuit 100 may adjust the pulse width of the output signal OUT.

The signal generation circuit 100 may include a synchronization circuit 110, a pulse width control circuit 120 and an output circuit 130. The synchronization circuit 110 may receive the input signal IN and the clock signal CLK, and generate a synchronization signal INS. The synchronization circuit 110 may generate the synchronization signal INS by synchronizing the input signal IN with the clock signal CLK. The synchronization circuit 110 may generate the synchronization signal INS having a pulse width corresponding to one period of the clock signal CLK in synchronization with an edge of the clock signal CLK. For example, the synchronization circuit 110 may receive an inverted signal of the clock signal CLK, and sample the input signal IN with a falling edge of the clock signal CLK. The synchronization circuit 110 may generate the synchronization signal INS having a pulse width which is enabled from the falling edge of the clock signal CLK to the next falling edge of the clock signal CLK. The synchronization circuit 110 may further receive an on control signal CON1. The synchronization circuit 110 may synchronize the input signal IN with the clock signal CLK, delay the signal synchronized with the clock signal CLK by a time corresponding to the on control signal CON1, and output the delayed signal as the synchronization signal INS. The on control signal CON1 may have a plurality of bits, and a time corresponding to the on control signal CON1 may be a multiple of the period of the clock signal CLK. In an embodiment, the synchronization circuit 110 may receive the clock signal CLK instead of the inverted signal of the clock signal. The synchronization circuit 110 may be modified to operate in synchronization with a rising edge of the clock signal CLK.

The pulse width control circuit 120 may receive the synchronization signal INS, the clock signal CLK and an off control signal CON2, and generate a start signal START and an end signal END. The pulse width control circuit 120 may generate the start signal START by delaying the synchronization signal INS by a predetermined time. The predetermined time may be randomly set, and will be described below. The pulse width control circuit 120 may generate the end signal END by delaying the synchronization signal INS by a time corresponding to the off control signal CON2 in synchronization with the clock signal CLK. For example, the pulse width control circuit 120 may generate a plurality of delay signals by sequentially delaying the synchronization signal INS by one period of the clock signal CLK in synchronization with the clock signal CLK. The pulse width control circuit 120 may output one of the plurality of delay signals as the end signal END based on the off control signal CON2. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The output circuit 130 may receive the start signal START and the end signal END and generate the output signal OUT. The output circuit 130 may generate the output signal OUT which is enabled based on the start signal START and disabled based on the end signal END. The output circuit 130 may enable the output signal OUT when the start signal START is enabled, and disable the output signal OUT when the end signal END is enabled. Therefore, the output signal OUT may have a pulse width that is enabled during an interval from a point of time that the start signal START is enabled to a point of time that the end signal END is enabled.

In FIG. 1, the pulse width control circuit 120 may include a delay unit 121, a shifter 122 and a selector 123. The delay unit 121 may receive the synchronization signal INS, delay the synchronization signal INS by the predetermined time, and output the delayed signal as the start signal START. The predetermined time and/or a delay time of the delay unit 121 may correspond to a delay time which occurs in the selector 123. The delay time of the delay unit 121 may be set by modeling the delay time which occurs in the selector 123.

The shifter 122 may receive the synchronization signal INS and the clock signal CLK, and generate a plurality of delay signals. The shifter 122 may generate the plurality of delay signals by sequentially delaying the synchronization signal INS by one period of the clock signal CLK in synchronization with the clock signal CLK. The shifter 22 may include a first flip-flop 122-1 and a plurality of flip-flops. The first flip-flop 122-1 may receive the synchronization signal INS through an input terminal thereof, and receive the inverted signal of the clock signal CLK through a clock terminal thereof. The first flip-flop 122-1 may delay the synchronization signal INS by a time corresponding to one period of the clock signal CLK in synchronization with a falling edge of the clock signal CLK, and output a first delay signal Q1 to an output terminal thereof. Each of the plurality of flip-flops may have an input terminal coupled to an output terminal of the flip-flop at the previous stage, and configured to receive the delay signal outputted from the flip-flop at the previous stage. The plurality of flip-flops may receive the inverted signal of the clock signal CLK through clock terminals thereof in common. The plurality of flip-flops may output the plurality of delay signals through the output terminals thereof, respectively. In FIG. 1, the plurality of flip-flops may include second to $n^{th}$ flip-flops 122-2 to 122-$n$. Here, n may be an integer equal to or more than 3. The second flip-flop 122-2 may receive the first delay signal Q1 through the input terminal thereof, and receive the inverted signal of the clock signal CLK through the clock terminal thereof. The second flip-flop 122-2 may delay the first delay signal Q1 by a time corresponding to one period of the clock signal in synchronization with a falling edge of the clock signal CLK, and output the delayed signal as a second delay signal Q2. The $n^{th}$ flip-flop 122-$n$ may receive the delay signal outputted from the flip-flop at the previous stage through the input terminal thereof, and receive the inverted signal of the clock signal CLK through the clock terminal thereof. The $n^{th}$ flip-flop 122-$n$ may delay the delay signal outputted from the flip-flop at the previous stage by a time corresponding to one period of the clock signal CLK in synchronization with a falling edge of the clock signal CLK, and output the delayed signal as an $n^{th}$ delay signal Qn. In an embodiment, the first to $n^{th}$ flip-flops 122-1 to 122-$n$ may receive the clock signal CLK instead of the inverted signal of the clock signal CLK, and operate in synchronization with a rising edge of the clock signal CLK.

The selector 123 may receive the plurality of delay signals outputted from the shifter 122 and the off control signal CON2. The selector 123 may output one of the plurality of delay signals as the end signal END based on the off control signal CON2. The off control signal CON2 may have a plurality of bits. The selector 123 may be implemented as a multiplexer to select one of the plurality of delay signals according to the off control signal CON2. The selector 123 may receive the first to n$^{th}$ delay signals Q1 to Qn, and output one of the first to n$^{th}$ delay signals Q1 to Qn as the end signal END based on the off control signal CON2. As one of the first to n$^{th}$ delay signals Q1 to Qn is outputted as the end signal END according to the off control signal CON2, the end signal END delayed from the synchronization signal INS by a time corresponding to the off control signal CON2 may be generated. The delay time of the delay unit 121 may correspond to the delay time which occurs when the selector 123 generates the end signal END from the plurality of delay signals.

The output circuit 130 may include a latch circuit 131. The latch circuit 131 may be an SR latch. The latch circuit 131 may receive an inverted signal of the start signal START through a set terminal S thereof, receive an inverted signal of the end signal END through a reset terminal R thereof, and output the output signal OUT to an output terminal Q thereof. The latch circuit 131 may enable the output signal OUT to a logic high level when the start signal START is enabled to a logic low level, and disable the output signal OUT to a logic low level when the end signal END is enabled to a logic low level. In an embodiment, when the first to nth flip-flops 122-1 to 122-n operate in synchronization with the clock signal CLK, the latch circuit 131 may be modified to receive the start signal START instead of the inverted signal of the start signal START, through the set terminal S thereof, and receive the end signal END instead of the inverted signal of the end signal END, through the reset terminal R thereof.

Figure 2:
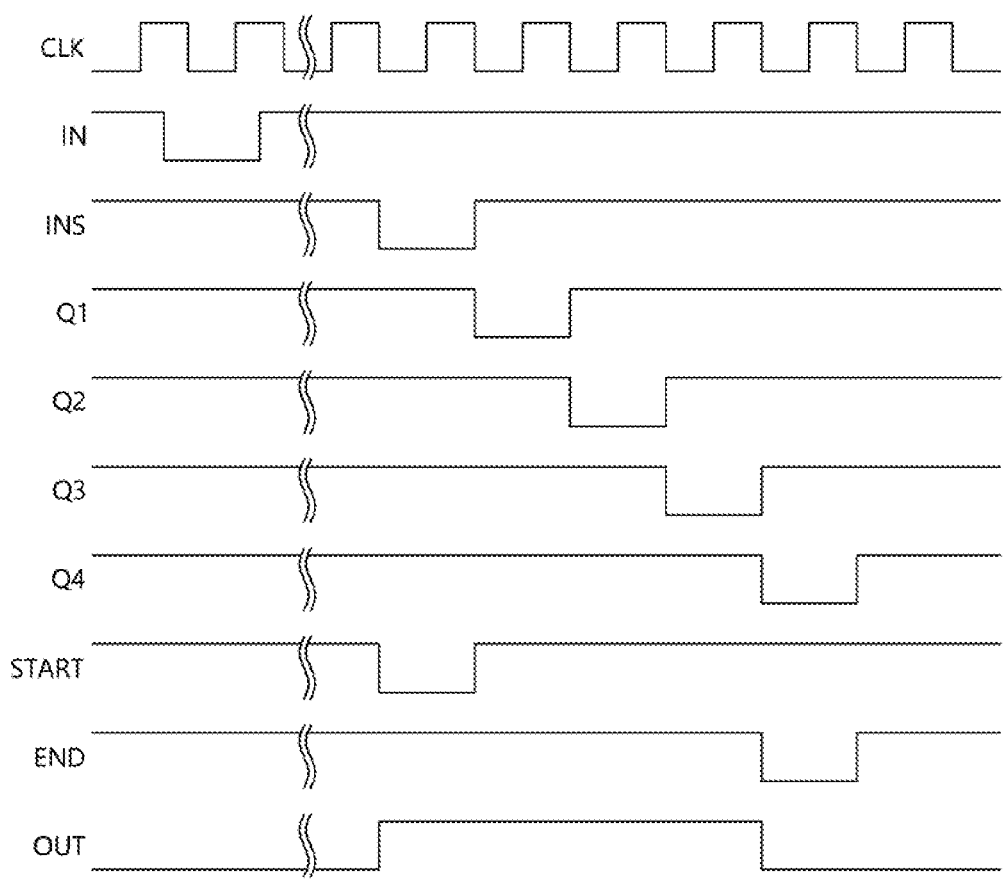
FIG. 2 is a timing diagram illustrating an operation of the signal generation circuit in accordance with an embodiment.

FIG. 2 is a timing diagram illustrating an operation of the signal generation circuit 100 in accordance with an embodiment. Referring to FIGS. 1 and 2, the operation of the signal generation circuit 100 in accordance with an embodiment will be described as follows. When the input signal IN is enabled, the synchronization circuit 110 may generate the synchronization signal INS enabled during one period of the clock signal CLK by synchronizing the input signal IN with a falling edge of the clock signal CLK. The synchronization signal INS may be delayed input signal IN by a multiple of the period of the clock signal CLK, based on the on control signal CON1. The delay unit 121 may generate the start signal START by delaying the synchronization signal INS. When the start signal START is enabled to a logic low level, the output circuit 130 may enable the output signal OUT to a logic high level. The first flip-flop 122-1 of the shifter 122 may generate the first delay signal Q1 enabled during one period of the clock signal CLK by delaying the synchronization signal INS in synchronization with a falling edge of the clock signal CLK. The second flip-flop 122-2 to the n$^{th}$ flip-flop 122-n may generate the second to n$^{th}$ delay signals Q2 to Qn which are sequentially delayed by a time corresponding to one period of the clock signal CLK in synchronization with falling edges of the clock signal CLK. The second delay signal Q2 may be generated by delaying the first delay signal Q1 by a time corresponding to one period of the clock signal CLK, the third delay signal Q3 may be generated by delaying the second delay signal Q2 by a time corresponding to one period of the clock signal CLK, and the fourth delay signal Q4 may be generated by delaying the third delay signal Q3 by a time corresponding to one period of the clock signal CLK. The second to n$^{th}$ delay signals Q2 to Qn may be enabled during one period of the clock signal CLK. When the off control signal CON2 has a value corresponding to 4, the selector 123 may output the fourth delay signal Q4 as the end signal END according to the off control signal CON2. The end signal END may have a pulse width corresponding to the fourth delay signal Q4. When the end signal END is enabled to a logic low level, the output circuit 130 may disable the output signal OUT. Because the signal generation circuit 100 sequentially delays the synchronization signal INS using the flip-flops, the signal generation circuit 100 may generate the plurality of delay signals having a predetermined pulse width (i.e. one period of the clock signal CLK) in synchronization with falling edges of the clock signal CLK. The delay unit 121 may generate the start signal START by delaying the synchronization signal INS during a delay time corresponding to a delay time which occurs in the selector 123, and thus match the generation timing of the start signal START with the generation timing of the end signal END.

Figure 3:
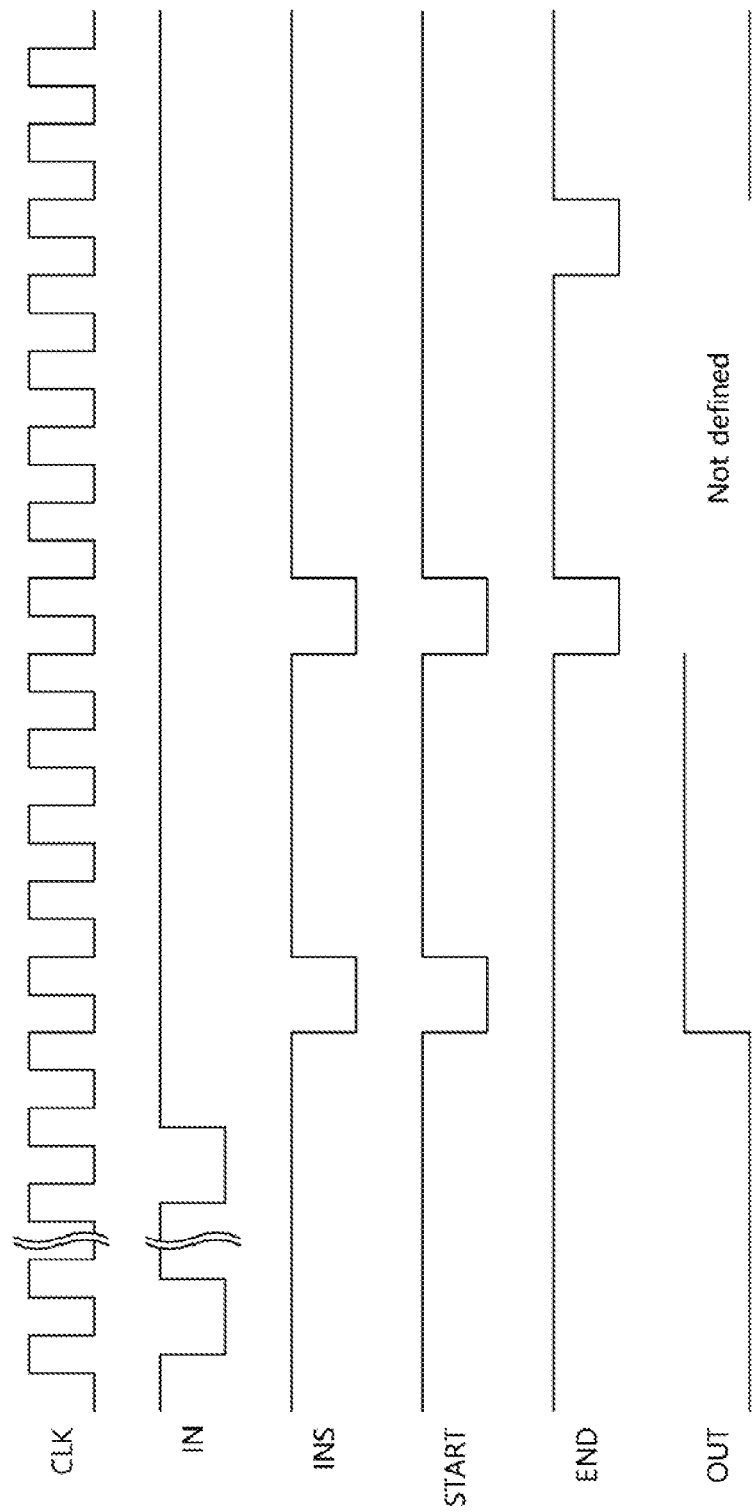
FIG. 3 is a diagram illustrating another operation of the signal generation circuit in accordance with an embodiment.

FIG. 3 is a diagram illustrating another operation of the signal generation circuit 100 in accordance with an embodiment. Referring to FIGS. 1 and 3, a plurality of input signals IN may be sequentially inputted to the signal generation circuit 100. The synchronization circuit 110 may generate the synchronization signal INS by synchronizing the input signal IN with the clock signal CLK, whenever the input signal IN is inputted. For example, the synchronization circuit 110 may generate a first synchronization signal INS by delaying a first input signal IN, and generate a second synchronization signal INS by delaying a second input signal IN. The delay unit 121 may generate a first pulse of the start signal START based on the first synchronization signal INS, and generate a second pulse of the start signal START based on the second synchronization signal INS. The shifter 122 may output one of a plurality of delay signals, generated by delaying the first synchronization signal INS, as a first pulse of the end signal END, and output one of a plurality of delay signals, generated by delaying the second synchronization signal INS, as a second pulse of the end signal END. When it is assumed that a time interval between the first and second synchronization signals INS corresponds to four periods of the clock signal CLK and a time corresponding to the off control signal CON2 corresponds to four periods of the clock signal CLK, the start signal START generated from the second synchronization signal INS and the end signal END generated from the first synchronization signal INS may be enabled to have the same pulse width at the same timing. The output circuit 130 is implemented as an SR latch. Thus, when the start signal START and the end signal END are enabled at the same timing, the voltage level of the output signal OUT might not be defined, and the output signal OUT might not be normally generated.

Figure 4:
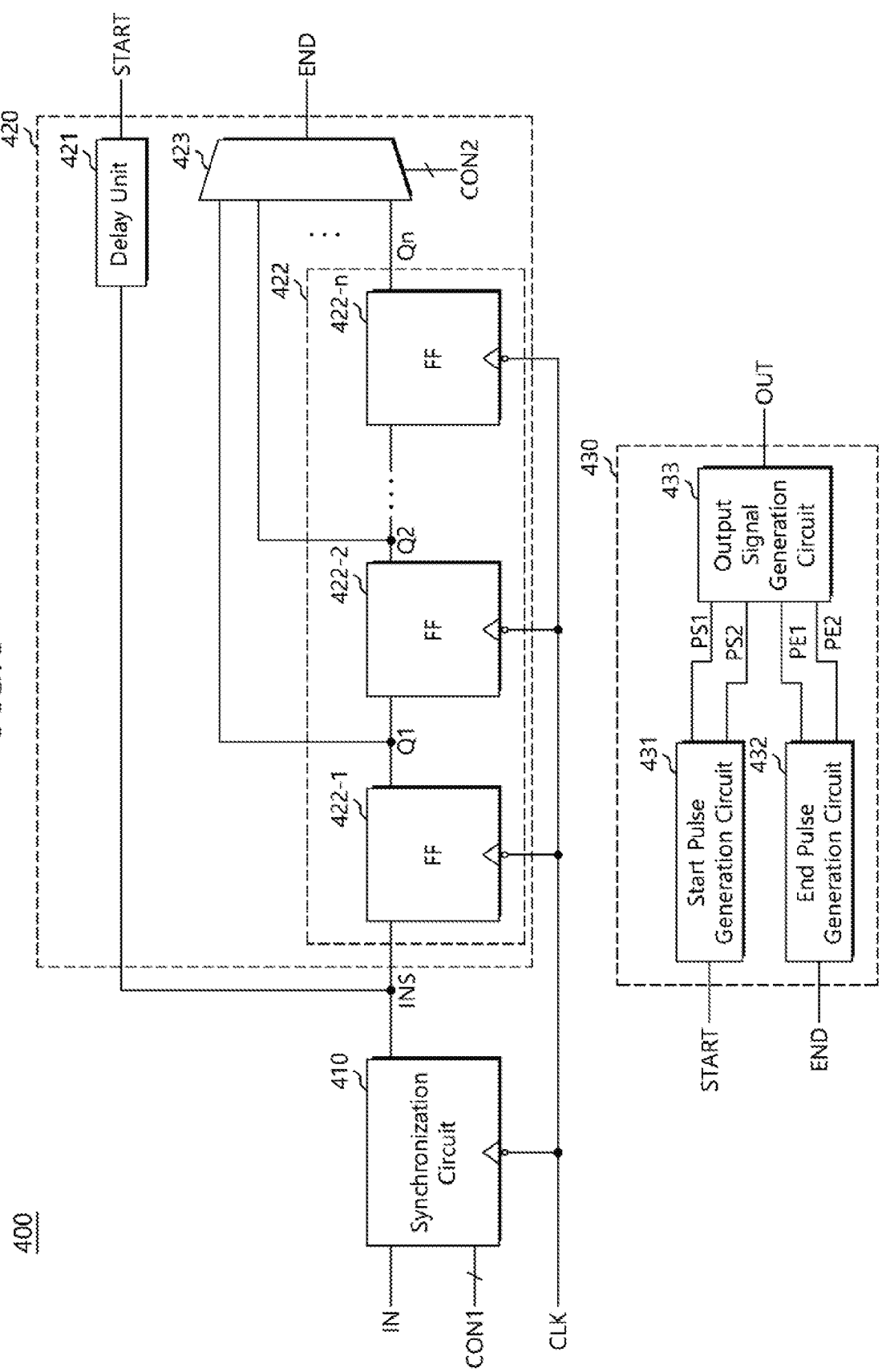
FIG. 4 is a block diagram illustrating a configuration of a signal generation circuit in accordance with an embodiment.

FIG. 4 is a diagram illustrating a configuration of a signal generation circuit 400 in accordance with an embodiment. Referring to FIG. 4, the signal generation circuit 400 may be configured to mitigate or prevent the effects associated with having the start signal START and the end signal END being enabled at the same time as illustrated in FIG. 3. The signal generation circuit 400 may include a synchronization circuit 410, a pulse width control circuit 420 and an output circuit 430. The synchronization circuit 410 may generate a synchronization signal INS by synchronizing an input signal IN with a clock signal CLK, whenever the input signal IN is inputted. The synchronization circuit 410 may have the same configuration as the synchronization circuit 110 illustrated in FIG. 1, and the overlapping descriptions for the same components will be omitted herein.

The pulse width control circuit 420 may generate a start signal START by delaying the synchronization signal INS, and generate an end signal END by delaying the synchronization signal INS by a time corresponding to an off control signal CON2 in synchronization with the clock signal CLK.

Because the pulse width control circuit 420 generates the start signal START and the end signal END from the synchronization signal INS whenever the input signal IN is inputted, the pulse width control circuit 420 may generate a plurality of start signals START and a plurality of end signals END when the input signal IN is inputted a plurality of times. The pulse width control circuit 420 may include a delay unit 421, a shifter 422 and a selector 423, and the shifter 422 may include a first flip-flop 422-1 and a plurality of flip-flops 422-2 to 422-n. The pulse width control circuit 420 may have the same configuration as the pulse width control circuit 120 illustrated in FIG. 1, and the overlapping descriptions for the same components will be omitted herein.

The output circuit 430 may generate an output signal OUT which is enabled based on the plurality of start signals START and disabled based on the plurality of end signals END. The output circuit 430 may enable the output signal OUT based on the start signal START which does not overlap the end signal END, among the plurality of start signals START. The output circuit 430 may disable the output signal OUT based on the end signal END which does not overlap the start signal START, among the plurality of end signals END. The output circuit 430 may retain the enabled state of the output signal OUT, when the start signal START and the end signal END overlap each other.

The output circuit 430 may include a start pulse generation circuit 431, an end pulse generation circuit 432 and an output signal generation circuit 433. The start pulse generation circuit 431 may receive the start signal START from the pulse width control circuit 420. The start pulse generation circuit 431 may generate a plurality of start pulses based on the start signal START. For example, the start pulse generation circuit 431 may generate a first start pulse PS1 and a second start pulse PS2 based on the start signal START. The start pulse generation circuit 431 may alternately enable the first and second start pulses PS1 and PS2 whenever the start signal START is enabled. In an embodiment, the number of the start pulses may be equal to or more than 3, and the start pulse generation circuit 431 may be modified to cyclically enable three or more start pulses whenever the start signal START is enabled.

The end pulse generation circuit 432 may receive the end signal END from the pulse width control circuit 420. The end pulse generation circuit 432 may generate a plurality of end pulses based on the end signal END. For example, the end pulse generation circuit 432 may generate a first end pulse PE1 and a second end pulse PE2 based on the end signal END. The end pulse generation circuit 432 may alternately enable the first and second end pulses PE1 and PE2 whenever the end signal END is enabled. In an embodiment, the number of the end pulses may be equal to or more than 3, and the end pulse generation circuit 432 may be modified to cyclically enable three or more end pulses whenever the end signal END is enabled.

The output signal generation circuit 433 may receive the plurality of start pulses from the start pulse generation circuit 431, and receive the plurality of end pulses from the end pulse generation circuit 432. The output signal generation circuit 433 may generate the output signal OUT based on the plurality of start pulses and the plurality of end pulses. The output signal generation circuit 433 may generate the output signal OUT based on the first start pulse PS1, the second start pulse PS2, the first end pulse PE1 and the second end pulse PE2. The first start pulse PS1 enabled for the first time might not overlap the second end pulse PE2, and the output signal generation circuit 433 may enable the output signal OUT based on the first start pulse PS1. When the first end pulse PE1 is enabled earlier than the second start pulse PS2, the output signal generation circuit 433 may disable the output signal OUT based on the first end pulse PE1. When the first end pulse PE1 overlaps the second start pulse PS2 or is enabled later than the second start pulse PS2, the output signal generation circuit 433 might not disable the output signal OUT based on the first end pulse PE1, but retain the enabled state of the output signal OUT. When the second end pulse PE2 is enabled earlier than the first start pulse PS1, the output signal generation circuit 433 may disable the output signal OUT based on the second end pulse PE2. When the second end pulse PE2 overlaps the first start pulse PS1 or is enabled later than the first start pulse PS1, the output signal generation circuit 433 might not disable the output signal OUT based on the second end pulse PE2, but retain the enabled state of the output signal OUT. The output signal generation circuit 433 may disable the output signal OUT based on the first end pulse PE1 or the second end pulse PE2 which does not overlap the first start pulse PS1 or the second start pulse PS2.

The output signal generation circuit 433 may generate a first pre-output signal based on the first start pulse PS1 and the first end pulse PE1, and generate a second pre-output signal based on the second start pulse PS2 and the second end pulse PE2. The output signal generation circuit 433 may enable the first pre-output signal based on the first start pulse PS1, and disable the first pre-output signal based on the first end pulse PE1. The output signal generation circuit 433 may enable the second pre-output signal based on the second start pulse PS2, and disable the second pre-output signal based on the second end pulse PE2. The output signal generation circuit 433 may generate the output signal OUT by summing up the first and second pre-output signals.

Figure 5:
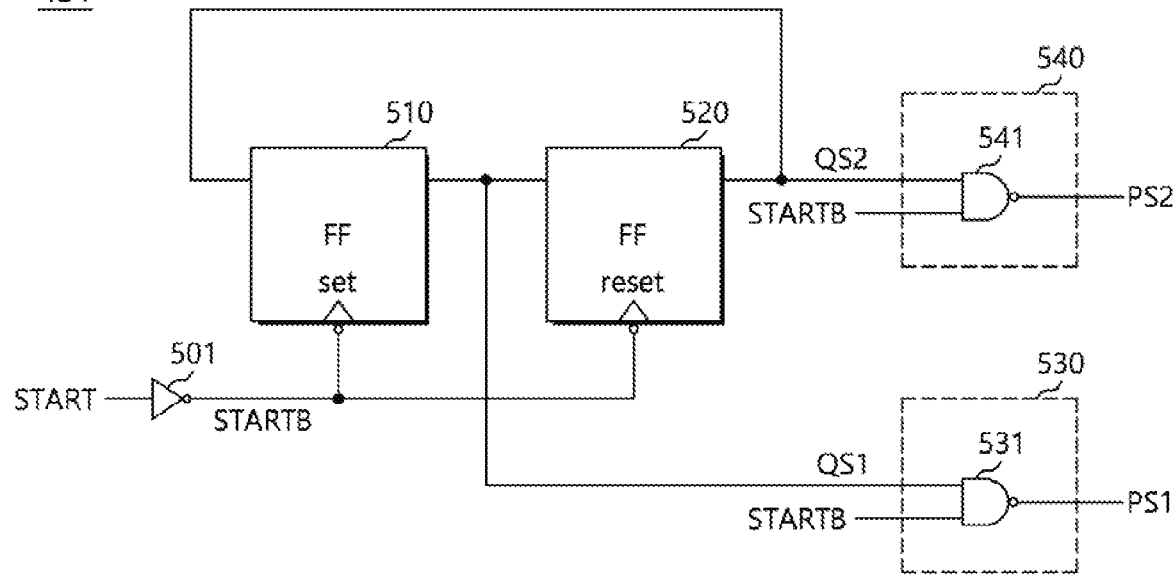
FIG. 5 is a diagram illustrating a configuration of a start pulse generation circuit illustrated in FIG. 4.

FIG. 5 is a diagram illustrating the configuration of the start pulse generation circuit 431 illustrated in FIG. 4. Referring to FIG. 5, the start pulse generation circuit 431 may include an inverter 501, a first flip-flop 510, a second flip-flop 520, a first gating circuit 530 and a second gating circuit 540. The inverter 501 may invert the start signal START, and output a complementary signal STARTB of the start signal. The first flip-flop 510 may generate a first pre-start pulse QS1 from a second pre-start pulse QS2 in synchronization with the complementary signal STARTB of the start signal. For example, the first flip-flop 510 may receive an inverted signal of the complementary signal STARTB of the start signal, and output the second pre-start pulse QS2 as the first pre-start pulse QS1 in synchronization with a falling edge of the complementary signal STARTB of the start signal. The first flip-flop 510 may be a flip-flop to reset the first pre-start pulse QS1 to a logic high level. The second flip-flop 520 may generate the second pre-start pulse QS2 from the first pre-start pulse QS1 in synchronization with the complementary signal STARTB of the start signal. For example, the second flip-flop 520 may receive the inverted signal of the complementary signal STARTB of the start signal, and output the first pre-start pulse QS1 as the second pre-start pulse QS2 in synchronization with a falling edge of the complementary signal STARTB of the start signal. The second flip-flop 520 may be a flip-flop to reset the second pre-start pulse QS2 to a logic low level.

The first gating circuit 530 may generate the first start pulse PS1 by gating the first pre-start pulse QS1 and the start signal START. The first gating circuit 530 may receive the first pre-start pulse QS1 and the complementary signal STARTB of the start signal. The first gating circuit 530 may include a first NAND gate 531. The first NAND gate 531 may enable the first start pulse PS1 to a logic low level when the first pre-start pulse QS1 and the complementary signal STARTB of the start signal are all at a logic high level. The second gating circuit 540 may generate the second start pulse PS2 by gating the second pre-start pulse QS2 and the start signal START. The second gating circuit 540 may receive the second pre-start pulse QS2 and the complementary signal STARTB of the start signal. The second gating circuit 540 may include a second NAND gate 541. The second NAND gate 541 may enable the second start pulse PS2 to a logic low level when the second pre-start pulse QS2 and the complementary signal STARTB of the start signal are all at a logic high level.

Figure 6:
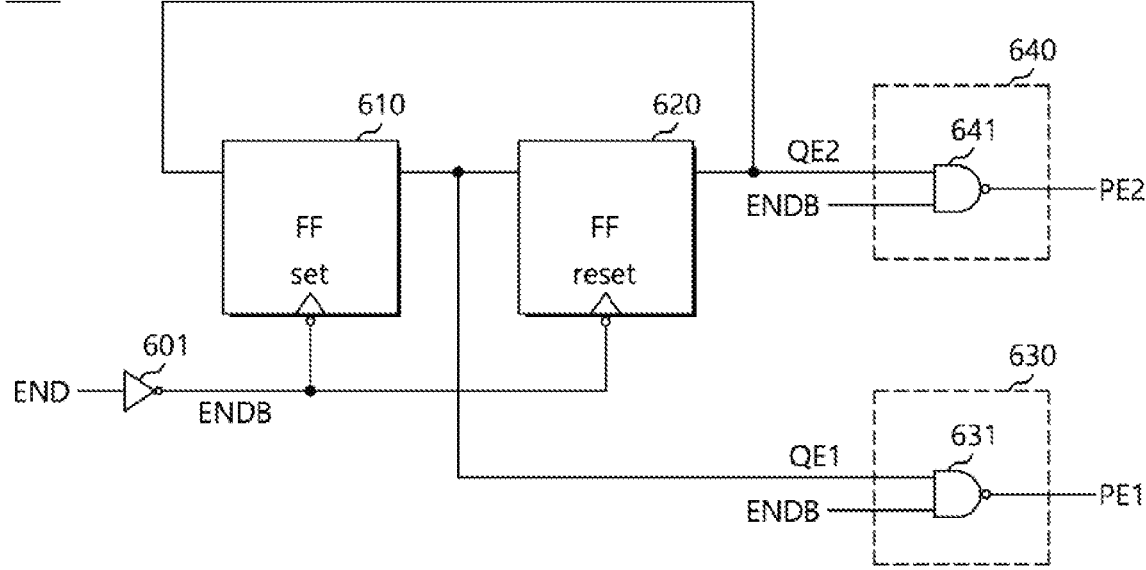
FIG. 6 is a diagram illustrating a configuration of an end pulse generation circuit illustrated in FIG. 4.

FIG. 6 is a diagram illustrating the configuration of the end pulse generation circuit 432 illustrated in FIG. 4. Referring to FIG. 6, the end pulse generation circuit 432 may include an inverter 601, a first flip-flop 610, a second flip-flop 620, a first gating circuit 630 and a second gating circuit 640. The inverter 601 may invert the end signal END, and output a complementary signal ENDB of the end signal. The first flip-flop 610 may generate a first pre-end pulse QE1 from a second pre-end pulse QE2 in synchronization with the complementary signal ENDB of the end signal. For example, the first flip-flop 610 may receive an inverted signal of the complementary signal ENDB of the end signal, and output the second pre-end pulse QE2 as the first pre-end pulse QE1 in synchronization with a falling edge of the complementary signal ENDB of the end signal. The first flip-flop 610 may be a flip-flop to reset the first pre-end pulse QE1 to a logic high level. The second flip-flop 620 may generate the second pre-end pulse QE2 from the first pre-end pulse QE1 in synchronization with the complementary signal ENDB of the end signal. For example, the second flip-flop 620 may receive the inverted signal of the complementary signal ENDB of the end signal, and output the first pre-end pulse QE1 as the second pre-end pulse QE2 in synchronization with a falling edge of the complementary signal ENDB of the end signal. The second flip-flop 620 may be a flip-flop to reset the second pre-end pulse QE2 to a logic low level.

The first gating circuit 630 may generate the first end pulse PE1 by gating the first pre-end pulse QE1 and the end signal END. The first gating circuit 630 may receive the first pre-end pulse QE1 and the complementary signal ENDB of the end signal. The first gating circuit 630 may include a first NAND gate 631. The first NAND gate 631 may enable the first end pulse PE1 to a logic low level when the first pre-end pulse QE1 and the complementary signal ENDB of the end signal are all at a logic high level. The second gating circuit 640 may generate the second end pulse PE2 by gating the second pre-end pulse QE2 and the end signal END. The second gating circuit 640 may receive the second pre-end pulse QE2 and the complementary signal ENDB of the end signal. The second gating circuit 640 may include a second NAND gate 641. The second NAND gate 641 may enable the second end pulse PE2 to a logic low level when the second pre-end pulse QE2 and the complementary signal ENDB of the end signal are all at a logic high level.

Figure 7:
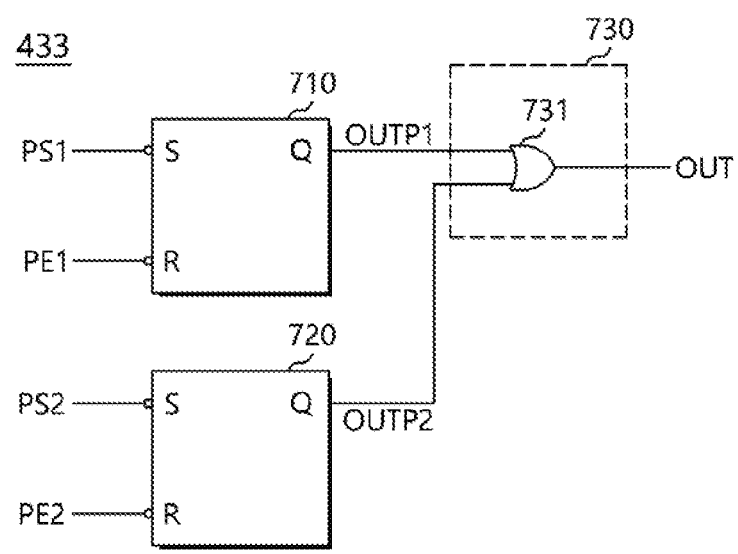
FIG. 7 is a diagram illustrating a configuration of an output signal generation circuit illustrated in FIG. 4.

FIG. 7 is a diagram illustrating the configuration of the output signal generation circuit 433 illustrated in FIG. 4. The output signal generation circuit 433 may include a first latch circuit 710, a second latch circuit 720 and a gating circuit 730. The first latch circuit 710 may receive the first start pulse PS1 and the first end pulse PE1. The first latch circuit 710 may generate a first pre-output signal OUTP1 based on the first start pulse PS1 and the first end pulse PE1. The first latch circuit 710 may enable the first pre-output signal OUTP1 based on the first start pulse PS1, and disable the first pre-output signal OUTP1 based on the first end pulse PE1. The first latch circuit 710 may generate the first pre-output signal OUTP1 which is enabled during an interval from a point of time that the first start pulse PS1 is enabled to a point of time that the first end pulse PE1 is disabled. For example, the first latch circuit 710 may enable the first pre-output signal OUTP1 to a logic high level when the first start pulse PS1 is enabled to a logic low level, and disable the first pre-output signal OUTP1 to a logic low level when the first end pulse PE1 is enabled to a logic low level. The first latch circuit 710 may be an SR latch. The first latch circuit 710 may receive an inverted signal of the first start pulse PS1 through a set terminal S thereof, receive an inverted signal of the first end pulse PE1 through a reset terminal R thereof, and output the first pre-output signal OUTP1 to an output terminal Q thereof.

The second latch circuit 720 may receive the second start pulse PS2 and the second end pulse PE2. The second latch circuit 720 may generate a second pre-output signal OUTP2 based on the second start pulse PS2 and the second end pulse PE2. The second latch circuit 720 may enable the second pre-output signal OUTP2 based on the second start pulse PS2, and disable the second pre-output signal OUTP2 based on the second end pulse PE2. The second latch circuit 720 may generate the second pre-output signal OUTP2 which is enabled during an interval from a point of time that the second start pulse PS2 is enabled to a point of time that the second end pulse PE2 is disabled. For example, the second latch circuit 720 may enable the second pre-output signal OUTP2 to a logic high level when the second start pulse PS2 is enabled to a logic low level, and disable the second pre-output signal OUTP2 to a logic low level when the second end pulse PE2 is enabled to a logic low level. The second latch circuit 720 may be an SR latch. The second latch circuit 720 may receive an inverted signal of the second start pulse PS2 through a set terminal S thereof, receive an inverted signal of the second end pulse PE2 through a reset terminal R thereof, and output the second pre-output signal OUTP2 to an output terminal Q thereof.

The gating circuit 730 may receive the first pre-output signal OUTP1 and the second pre-output signal OUTP2. The gating circuit 730 may generate the output signal OUT by summing up the first pre-output signal OUTP1 and the second pre-output signal OUTP2. The gating circuit 730 may include an OR gate 731. The OR gate 731 may perform an OR operation on the first and second pre-output signals OUTP1 and OUTP2, and output the output signal OUT.

Figure 8:
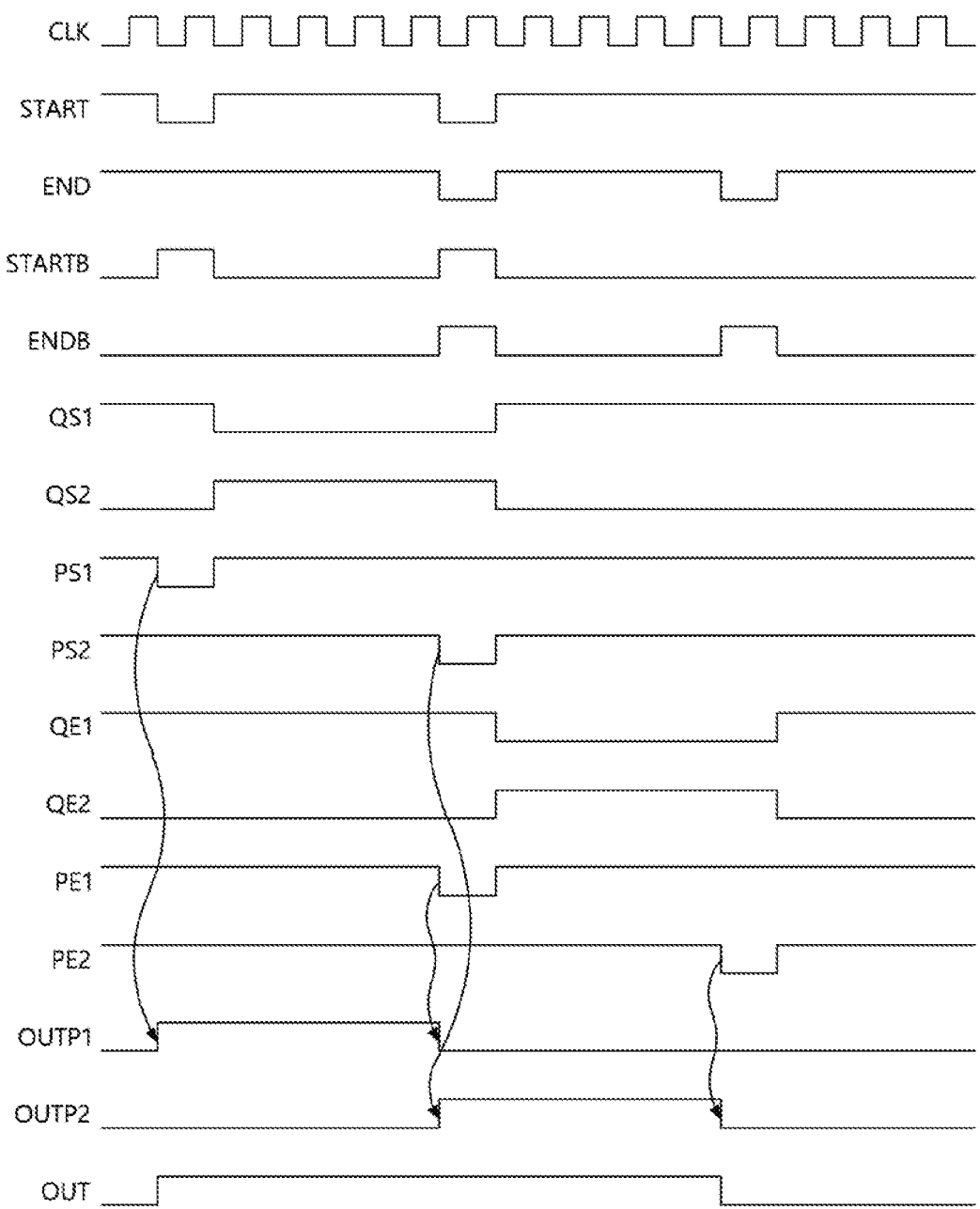
FIG. 8 is a timing diagram illustrating an operation of the signal generation circuit in accordance with an embodiment.

FIG. 8 is a diagram illustrating an operation of the signal generation circuit 400 in accordance with an embodiment. Referring to FIGS. 3 to 8, the operation of the signal generation circuit 400 in accordance with an embodiment will be described as follows. FIG. 8 illustrates the case in which the input signal IN is inputted two times as illustrated in FIG. 3. Furthermore, FIG. 8 illustrates the case in which a time corresponding to the off control signal CON2 is four periods of the clock signal CLK, and the end signal END is generated by delaying the start signal START by four periods of the clock signal CLK. When the first start signal START is enabled based on the input signal IN inputted for the first time, the inverter 501 of the start pulse generation circuit 431 may enable the complementary signal STARTB of the start signal to a logic high level. The first flip-flop 510 of the start pulse generation circuit 431 may change the first pre-start pulse QS1 to a logic low level when the complementary signal STARTB of the start signal is disabled to a logic low level. The second flip-flop 520 of the start pulse generation circuit 431 may change the second pre-start pulse QS2 to a logic high level. The first gating circuit 530 of the start pulse generation circuit 431 may generate the first start pulse PS1 which is enabled to a logic low level during an interval from a point of time that the complementary signal STARTB of the start signal is enabled to a logic high level to a point of time that the first pre-start pulse QS1 transitions to a logic low level. The first latch circuit 710 of the output signal generation circuit 433 may enable the first pre-output signal OUTP1 to a logic high level when the first start pulse PS1 is enabled to a logic low level.

When a time corresponding to four periods of the clock signal CLK elapses, the first end signal END may be enabled, and the inverter 601 of the end pulse generation circuit 432 may enable the complementary signal ENDB of the end signal to a logic high level. At this time, the second start signal START may be enabled based on the input signal IN inputted for the second time, and the complementary signal STARTB of the start signal may also be enabled to a logic high level. The first flip-flop 610 of the end pulse generation circuit 432 may change the first pre-end pulse QE1 to a logic low level when the complementary signal ENDB of the end signal is disabled to a logic low level. Furthermore, the second flip-flop 620 of the end pulse generation circuit 432 may change the second pre-end pulse QE2 to a logic high level. The first gating circuit 630 of the end pulse generation circuit 432 may generate the first end pulse PE1 which is enabled to a logic low level during an interval from a point of time that the complementary signal ENDB of the end signal is enabled to a logic high level to a point of time that the first pre-end pulse QE1 transitions to a logic low level. The first latch circuit 710 of the output signal generation circuit 433 may disable the first pre-output signal OUTP1 to a logic low level when the first end pulse PE1 is enabled to a logic low level.

The complementary signal STARTB of the start signal may also be enabled to a logic high level at the same time as the complementary signal ENDB of the end signal is enabled. When the complementary signal STARTB of the start signal is disabled to a logic low level, the first flip-flop 510 of the start pulse generation circuit 431 may change the first pre-start pulse QS1 to a logic high level, and the second flip-flop 520 may change the second pre-start pulse QS2 to a logic low level. The second gating circuit 540 of the start pulse generation circuit 431 may generate the second start pulse PS2 which is enabled to a logic low level during an interval from a point of time that the complementary signal STARTB of the start signal is enabled to a logic high level to a point of time that the second pre-start pulse QS2 transitions to a logic low level. The second latch circuit 720 of the output signal generation circuit 433 may enable the second pre-output signal OUTP2 to a logic high level when the second start pulse PS2 is enabled to a logic low level. The gating circuit 730 of the output signal generation circuit 433 may generate the output signal OUT by summing up the first and second pre-output signals OUTP1 and OUTP2. Therefore, although the first pre-output signal OUTP1 is disabled by the first latch circuit 710, the second pre-output signal OUTP2 may be enabled by the second latch circuit 720. Thus, the output signal generation circuit 433 may retain the output signal OUT at a logic high level.

When a time corresponding to four periods of the clock signal CLK elapses, the second end signal END may be enabled, and the inverter 601 of the end pulse generation circuit 432 may enable the complementary signal ENDB of the end signal to a logic high level. When the complementary signal ENDB of the end signal is disabled to a logic low level, the first flip-flop 610 of the end pulse generation circuit 432 may change the first pre-end pulse QE1 to a logic high level, and the second flip-flop 620 may change the second pre-end pulse QE2 to a logic low level. The second gating circuit 640 of the end pulse generation circuit 432 may generate the second end pulse PE2 which is enabled to a logic low level during an interval from a point of time that the complementary signal ENDB of the end signal is enabled to a logic high level to a point of time that the second pre-end pulse QE2 transitions to a logic low level. The second latch circuit 720 of the output signal generation circuit 433 may disable the second pre-output signal OUTP2 to a logic low level when the second end pulse PE2 is enabled to a logic low level. Therefore, the output signal generation circuit 433 may generate the output signal OUT which is enabled to a logic high level during an interval from a point of time that the first start pulse PS1 is enabled to a logic low level to a point of time that the second end pulse PE2 is enabled to a logic low level.

Figure 9:
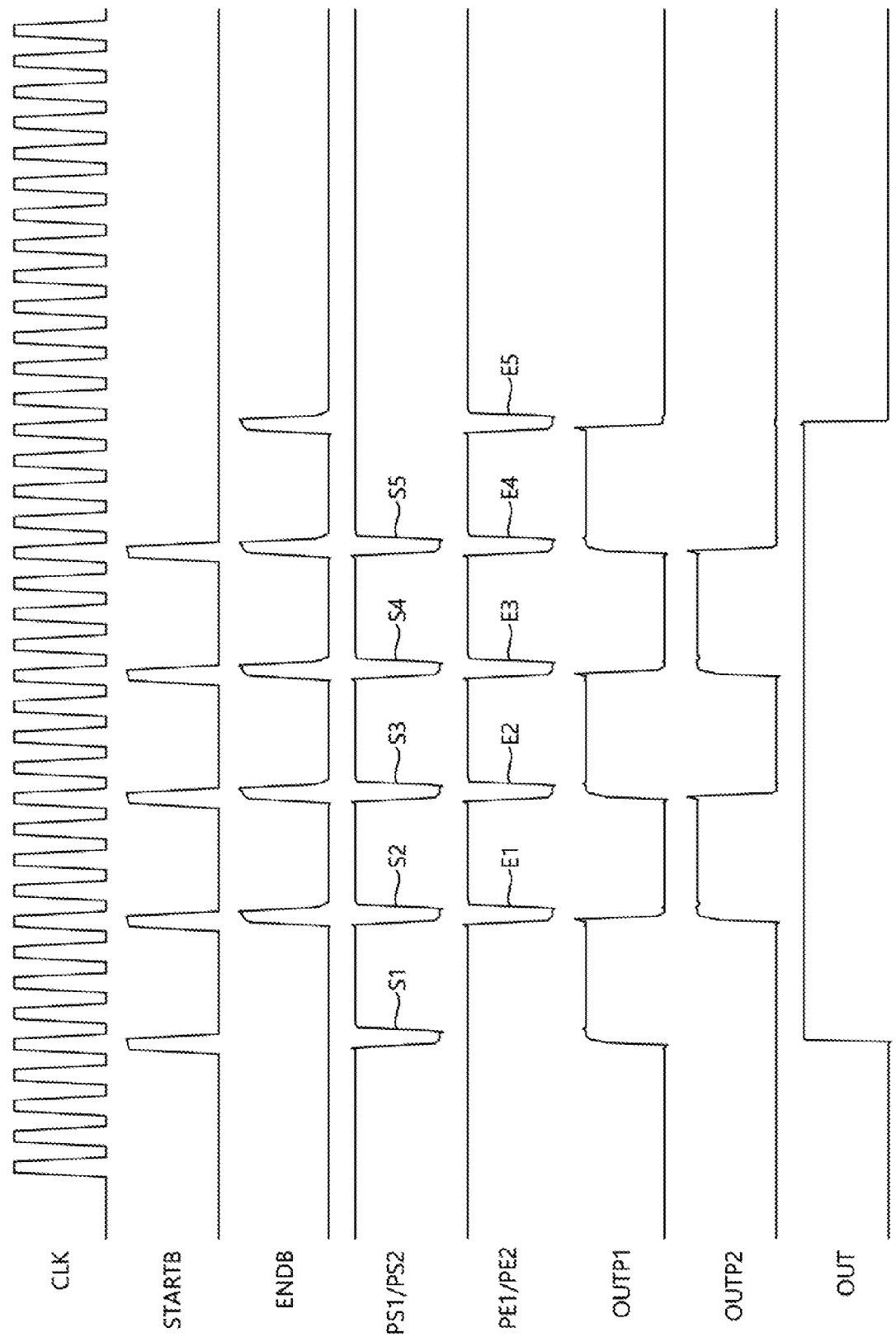
FIG. 9 is a diagram illustrating another operation of the signal generation circuit in accordance with an embodiment.

FIG. 9 is a timing diagram illustrating another operation of the signal generation circuit 400 in accordance with an embodiment. FIG. 9 illustrates the case in which the input signal IN is inputted five times to enable the start signal START and the end signal END five times at intervals of three periods of the clock signal CLK, and the end signal END is generated by delaying the start signal START by three periods of the clock signal CLK. Referring to FIG. 9, after the first start signal S1 is enabled, the second start signal S2 and the first end signal E1 may be enabled at the same time, and the third start signal S3 and the second end signal E2 may be enabled at the same time. The fourth start signal S4 and the third end signal E3 may be enabled at the same time, and the fifth start signal S5 and the fourth end signal E4 may be enabled at the same time. Then, the fifth end signal E5 may be enabled.

When the first start signal S1 is enabled, the first start pulse PS1 may be enabled, and the first pre-output signal OUTP1 may be enabled to a logic high level. When the first end signal E1 is enabled, the first end pulse PE1 may be enabled, and the first pre-output signal OUTP1 may be disabled to a logic low level. Simultaneously, the second start pulse PS2 may be enabled based on the second start signal S2, and the second pre-output signal OUTP2 may be enabled to a logic high level. Therefore, although the second start signal S2 and the first end signal E1 overlap each other, the output signal OUT may retain a logic high level.

When the second end signal E2 is enabled, the second end pulse PE2 may be enabled, and the second pre-output signal OUTP2 may be disabled to a logic low level. Simultaneously, the first start pulse PS1 may be enabled again based on the third start signal S3, and the first pre-output signal OUTP1 may be enabled to a logic high level again. Therefore, although the third start signal S3 and the second end signal E2 overlap each other, the output signal OUT may retain a logic high level.

When the third end signal E3 is enabled, the first end pulse PE1 may be enabled, and the first pre-output signal OUTP1 may be disabled to a logic low level. Simultaneously, the second start pulse PS2 may be enabled again based on the fourth start signal S4, and the second pre-output signal OUTP2 may be enabled to a logic high level again. Therefore, although the fourth start signal S4 and the third end signal E3 overlap each other, the output signal OUT may retain a logic high level.

When the fourth end signal E4 is enabled, the second end pulse PE2 may be enabled, and the second pre-output signal OUTP2 may be disabled to a logic low level. Simultaneously, the first start pulse PS1 may be enabled again based on the fifth start signal S5, and the first pre-output signal OUTP1 may be enabled to a logic high level again. Therefore, although the fifth start signal S5 and the fourth end signal E4 overlap each other, the output signal OUT may retain a logic high level.

When the fifth end signal E5 is enabled, the first end pulse PE1 may be enabled, the first pre-output signal OUTP1 may be disabled to a logic low level, and the output signal OUT may also be disabled to a logic low level. Therefore, the signal generation circuit 400 may generate the output signal OUT that retains a logic high level during an interval from a point of time that the first start signal S1 is enabled based on the input signal IN inputted for the first time to a point of time that the fifth end signal E5 is enabled based on the input signal IN inputted for the last time (i.e. the fifth time).

Figure 10:
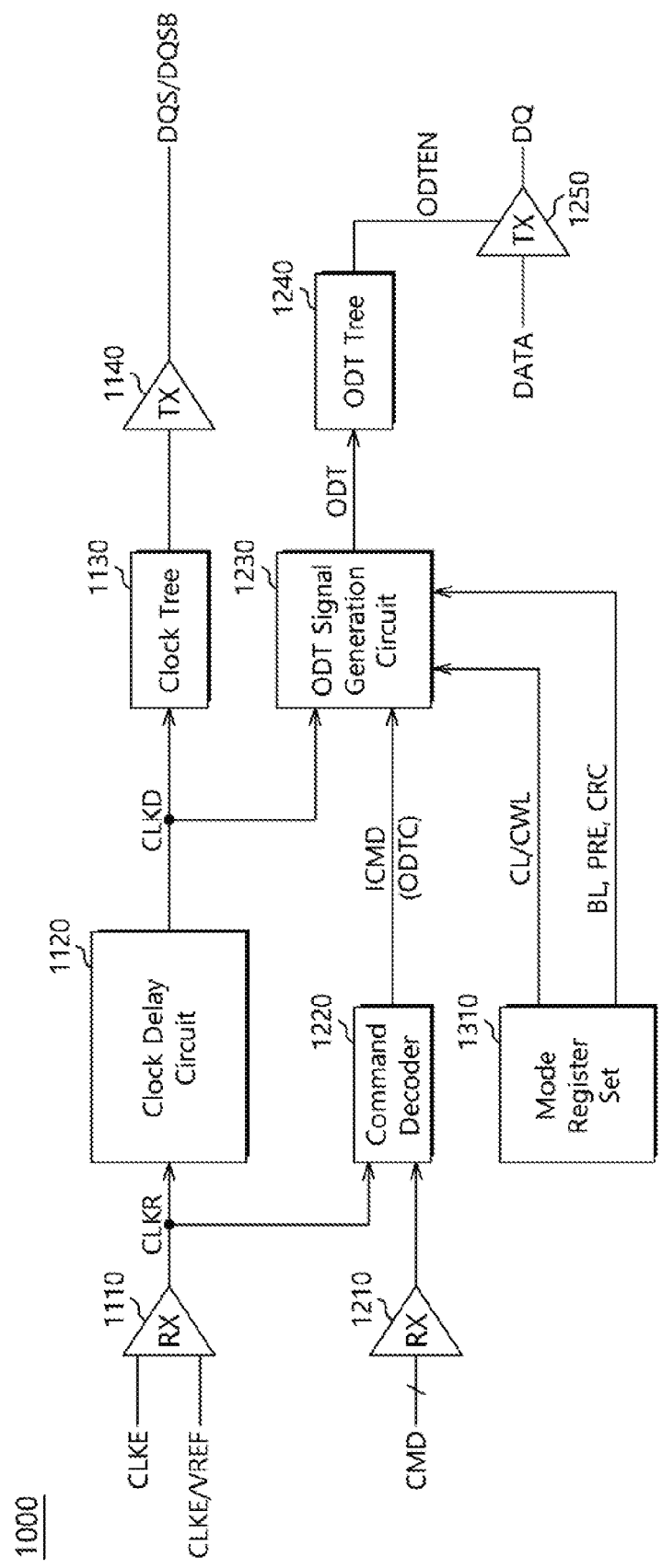
FIG. 10 is a diagram illustrating a configuration of a semiconductor apparatus in accordance with an embodiment.

FIG. 10 is a diagram illustrating a configuration of a semiconductor apparatus 1000 in accordance with an embodiment. In FIG. 10, the semiconductor apparatus 1000 may include a clock receiver 1110, a clock delay circuit 1120, a clock tree 1130, a strobe transmitter 1140, a command receiver 1210, a command decoder 1220, an ODT (On-Die Termination) signal generation circuit 1230, an ODT tree 1240, a data transmitter 1250 and a mode register set 1310. The clock receiver 1110 may receive an external clock signal CLKE transmitted from an external device. The external clock signal CLKE may be transmitted as a single-ended signal, or transmitted as a differential signal with a complementary signal CLKEB. In an embodiment, the clock receiver 1110 may generate a reference clock signal CLKR by differentially amplifying the external clock signals CLKE and CLKEB transmitted as differential signals. In an embodiment, the clock receiver 1110 may generate the reference clock signal CLKR by differentially amplifying a reference voltage VREF and the external clock signal CLKE transmitted as a single-ended signal. The reference voltage VREF may have a voltage level corresponding to the middle of the swing range of the external clock signal CLKE. The external clock signal CLKE and/or the reference clock signal CLKR may correspond to the clock signal CLK illustrated in FIG. 1.

The clock delay circuit 1120 may compensate for a delay amount by which the external clock signal CLKE is delayed through an internal circuit of the semiconductor apparatus 1000. The clock delay circuit 1120 may generate a delay-locked clock signal CLKD synchronized with the external clock signal CLKE by delaying the reference clock signal CLKR. The clock delay circuit 1120 may include a delay locked loop circuit configured to generate the delay-locked clock signal CLKD by delaying the reference clock signal CLKR. The delay-locked clock signal CLKD may correspond to the clock signal CLK illustrated in FIGS. 1 and 4.

The clock tree 1130 may delay and output the delay-locked clock signal CLKD. The delay-locked clock signal CLKD generated through the clock delay circuit 1120 may be outputted the strobe transmitter 1140 through the clock tree 1130. The strobe transmitter 1140 may output the signal outputted from the clock tree 1130 as a data strobe signal DQS/DQSB to an external device. The data strobe signal DQS/DQSB may be outputted to the external device in synchronization with data DQ outputted from the semiconductor apparatus 1000. The data strobe signal DQS/DQSB may be transmitted to the external device through a bus.

The command receiver 1210 may receive a command signal CMD transmitted from the external device. The command signal CMD may include a plurality of signals. The command signal CMD may include various pieces of information for controlling the semiconductor apparatus 1000 to perform a variety of operations. For example, the command signal CMD may include information for controlling the semiconductor apparatus 1000 to perform a termination operation. The termination operation may indicate an operation of setting a termination resistance value of a bus to which the semiconductor apparatus 1000 transmits data or a data strobe signal. For example, when the termination operation is performed, the data transmitter 1250 may be set to have the termination resistance value.

The command decoder 1220 may latch the command signal CMD received through the command receiver 1210 based on the reference clock signal CLKR, decode the latched signal, and output the decoded signal as an internal command signal ICMD. The command decoder 1220 may generate various internal command signals ICMD according to information included in the command signal CMD. The internal command signal ICMD may include a termination command signal ODTC.

The ODT signal generation circuit 1230 may receive the termination command signal ODTC generated through the command decoder 1220. The signal generation circuits 100 and 400 illustrated in FIGS. 1 and 4 may be applied as the ODT signal generation circuit 1230. The termination command signal ODTC may correspond to the input signal IN illustrated in FIGS. 1 and 4. The ODT signal generation circuit 1230 may perform a domain crossing operation on the termination command signal ODTC, and generate an on-die termination signal ODT based on the termination command signal ODTC. The on-die termination signal ODT may correspond to the output signal IN illustrated in FIGS. 1 and 4. Because the termination command signal ODTC is a signal delayed asynchronously with the reference clock signal RCLK, the ODT signal generation circuit 1230 may generate the on-die termination signal ODT by synchronizing the termination command signal ODTC with the delay-locked clock signal CLKD. The ODT signal generation circuit 1230 may generate the on-die termination signal ODT based on first time information and second time information. For example, the ODT signal generation circuit 1230 may generate the on-die termination signal ODT which is enabled after a predetermined time based on the first time information has passed because the termination command signal ODTC was enabled, and retains the enabled state during a time corresponding to the second time information. The ODT signal generation circuit 1230 may generate a start signal and an end signal in synchronization with the delay-locked clock signal CLKD, whenever the termination command signal ODTC is inputted. The ODT signal generation circuit 1230 may enable the on-die termination signal ODT based on the start signal which does not overlap the end signal. The ODT signal generation circuit 1230 may disable the on-die termination signal ODT based on the end signal which does not overlap the start signal.

The mode register set 1310 may provide the first time information and the second time information to the ODT signal generation circuit 1230. The mode register set 1310 may include various pieces of operation setting information related to various operations of the semiconductor apparatus 1000. The first time information may include column address strobe latency CL and/or column address strobe write latency CWL, for example. The ODT signal generation circuit 1230 may receive the column address strobe latency CL and/or the column address strobe write latency CWL, decide shifting latency from the column address strobe latency CL and/or the column address strobe write latency CWL, and delay the termination command signal ODTC based on the shifting latency. The shifting latency may have a smaller value than the column address strobe latency CL and/or the column address strobe write latency CWL. The shifting latency may correspond to the on control signal CON1 illustrated in FIGS. 1 and 4. The second time information may include one or more of a BL4 signal, a BL8 signal, a 2PRE signal and a CRC (Cyclic Redundancy Check) signal. The BL4 signal may indicate that a burst length is 4, and include information for setting an operation in which four data are successively outputted. The BL8 signal may indicate that a burst length is 8, and include information for setting an operation in which eight data are successively outputted. The 2PRE signal may include information for setting an operation in which the pre-amble of a data strobe signal used for transmitting data is generated during two periods of the external clock signal CLKE. The CRC signal may include information for setting an operation in which CRC information is continuously outputted after data are outputted during a time corresponding to the burst length. The BL4 signal, the BL8 signal, the 2PRE signal and the CRC signal may correspond to the off control signal CON2 illustrated in FIGS. 1 and 4. The ODT signal generation circuit 1230 may enable the on-die termination signal ODT after a time corresponding to the shifting latency has elapsed because the termination command signal ODTC was inputted, and the pulse of the on-die termination signal ODT may be retained during a time which is decided based on one or more of the BL4 signal, the BL8 signal, the 2PRE signal and the CRC signal.

The ODT tree 1240 may generate an on-die termination enable signal ODTEN by delaying the on-die termination signal ODT. The on-die termination signal ODT may be inputted to the data transmitter 1250 through the ODT tree 1240. The data transmitter 1250 may be set to have a termination resistance value when the on-die termination enable signal ODTEN is received. After the data transmitter 1250 is set to have the termination resistance value based on the on-die termination enable signal ODTEN, the data transmitter 1250 may output data DQ to the external device based on internal data DATA of the semiconductor apparatus 1000. The termination resistance value may have a resistance value matched with impedance of a receiving terminal of the bus, i.e. the external device.

While various embodiments have been described above, it will be understood to those skilled in the art that the embodiments described are examples only. Accordingly, the operating method of a data storage device described herein should not be limited based on the described embodiments.

What is claimed is:

1. A signal generation circuit comprising:
a synchronization circuit configured to synchronize an input signal with a clock signal to generate a synchronization signal;
a pulse width control circuit configured to delay the synchronization signal to generate a start signal, and delay the synchronization signal by a time corresponding to an off control signal in synchronization with the clock signal to generate an end signal; and
an output circuit configured to enable an output signal based on the start signal and disable the output signal based on the end signal.

2. The signal generation circuit according to claim 1, wherein the synchronization circuit further receives an on control signal,
wherein the synchronization circuit generates the synchronization signal by synchronizing the input signal with the clock signal and delaying the signal synchronized with the clock signal by a time corresponding to the on control signal.

3. The signal generation circuit according to claim 1, wherein the pulse width control circuit comprises:
a delay unit configured to delay the synchronization signal to generate the start signal;
a shifter configured to sequentially delay the synchronization signal by one period of the clock signal in synchronization with the clock signal to generate a plurality of delay signals; and
a selector configured to output one of the plurality of delay signals as the end signal based on the off control signal.

4. The signal generation circuit according to claim 3, wherein a delay time of the delay unit corresponds to a delay time which occurs when the selector generates the end signal from the plurality of delay signals.

5. The signal generation circuit according to claim 3, wherein the shifter comprises:
a first flip-flop configured to receive the clock signal through a clock terminal of the first flip-flop and receive the synchronization signal through an input terminal of the first flip-flop; and
a plurality of flip-flops each configured to receive the clock signal through a clock terminal thereof and having an input terminal coupled to an output terminal of the flip-flop positioned at the previous stage,
wherein the plurality of delay signals are outputted from the output terminals of the first flip-flop and the plurality of flip-flops, respectively.

6. A signal generation circuit comprising:
a synchronization circuit configured to synchronize an input signal with a clock signal to generate a synchronization signal, whenever the input signal is inputted;
a pulse width control circuit configured to delay the synchronization signal to generate a start signal, and delay the synchronization signal by a time corresponding to an off control signal in synchronization with the clock signal to generate an end signal; and
an output circuit configured to enable an output signal based on a start signal which does not overlap the end signal, and disable the output signal based on an end signal which does not overlap the start signal.

7. The signal generation circuit according to claim 6, wherein the output circuit is configured to retain the enabled state of the output signal when the start signal and the end signal overlap each other.

8. The signal generation circuit according to claim 6, wherein the synchronization circuit further receives an on control signal,
wherein the synchronization circuit generates the synchronization signal by synchronizing the input signal with the clock signal and delaying the signal synchronized with the clock signal by a time corresponding to the on control signal.

9. The signal generation circuit according to claim 6, wherein the pulse width control circuit comprises:
a delay unit configured to delay the synchronization signal to generate the start signal;
a shifter configured to sequentially delay the synchronization signal by one period of the clock signal in synchronization with the clock signal to generate a plurality of delay signals; and
a selector configured to output one of the plurality of delay signals as the end signal based on the off control signal.

10. The signal generation circuit according to claim 9, wherein a delay time of the delay unit corresponds to a delay time which occurs when the selector generates the end signal from the plurality of delay signals.

11. The signal generation circuit according to claim 9, wherein the shifter comprises:
a first flip-flop configured to receive the clock signal through a clock terminal of the first flip-flop, and receive the synchronization signal through an input terminal of the first flip-flop; and
a plurality of flip-flops each configured to receive the clock signal through a clock terminal thereof, and having an input terminal coupled to an output terminal of the flip-flop positioned at the previous stage,
wherein the plurality of delay signals are outputted from the output terminals of the first flip-flop and the plurality of flip-flops, respectively.

12. The signal generation circuit according to claim 6, wherein the output circuit comprises:
a start pulse generation circuit configured to generate a plurality of start pulses based on the start signal;
an end pulse generation circuit configured to generate a plurality of end pulses based on the end signal; and
an output signal generation circuit configured to generate an output signal based on the plurality of start pulses and the plurality of end pulses.

13. The signal generation circuit according to claim 12, wherein the start pulse generation circuit alternately enables a first pre-start pulse and a second pre-start pulse whenever the start signal is enabled, generates a first start pulse based on the first pre-start pulse and the start signal, and generates a second start pulse based on the second pre-start pulse and the start signal.

14. The signal generation circuit according to claim 12, wherein the start pulse generation circuit comprises:
a first flip-flop configured to generate a first pre-start pulse from a second pre-start pulse based on the start signal;
a second flip-flop configured to generate the second pre-start pulse from the first pre-start pulse based on the start signal;
a first gating circuit configured to gate the first pre-start pulse and the start signal to generate a first start pulse; and
a second gating circuit configured to gate the second pre-start pulse and the start signal to generate a second start pulse.

15. The signal generation circuit according to claim 12, wherein the end pulse generation circuit alternately enables a first pre-end pulse and a second pre-end pulse whenever the end signal is enabled, generates a first end pulse based on the first pre-end pulse and the end signal, and generates a second end pulse based on the second pre-end pulse and the end signal.

16. The signal generation circuit according to claim 12, wherein the end pulse generation circuit comprises:
a first flip-flop configured to generate a first pre-end pulse from a second pre-end pulse based on the end signal;
a second flip-flop configured to generate the second pre-end pulse from the first pre-end pulse based on the end signal;
a first gating circuit configured to gate the first pre-end pulse and the end signal to generate a first end pulse; and
a second gating circuit configured to gate the second pre-end pulse and the end signal to generate a second end pulse.

17. The signal generation circuit according to claim 12, wherein the plurality of start pulses comprise a first start pulse and a second start pulse, and the plurality of end pulses comprise a first end pulse and a second end pulse,
wherein the output signal generation circuit comprises:
a first latch circuit configured to generate a first pre-output signal that is enabled based on the first start pulse and disabled based on the first end pulse;
a second latch circuit configured to generate a second pre-output signal that is enabled based on the second start pulse and disabled based on the second end pulse; and
a gating circuit configured to sum up the first and second pre-output signals to generate the output signal.

* * * * *